(12) United States Patent
Levy et al.

(10) Patent No.: US 7,883,990 B2
(45) Date of Patent: Feb. 8, 2011

(54) HIGH RESISTIVITY SOI BASE WAFER USING THERMALLY ANNEALED SUBSTRATE

(75) Inventors: Max Levy, Essex Junction, VT (US);
Dale Martin, Hyde Park, VT (US);
Gerd Pfeiffer, Poughquag, NY (US);
James A. Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 697 days.

(21) Appl. No.: 11/931,371

(22) Filed: Oct. 31, 2007

(65) Prior Publication Data

US 2009/0110898 A1    Apr. 30, 2009

(51) Int. Cl.
*H01L 21/762*    (2006.01)
*H01L 21/46*    (2006.01)
(52) U.S. Cl. ...................... 438/459; 257/347
(58) Field of Classification Search .............. 438/977, 438/459, 479, 517; 257/347, 625, E27.137, 257/E27.144
See application file for complete search history.

(56) References Cited

U.S. PATENT DOCUMENTS 5,998,281 A * 12/1999 Aga et al. ................ 438/459
6,362,076 B1 * 3/2002 Inazuki et al. ............ 438/458
6,784,494 B2    8/2004 Mitani
7,696,058 B2 * 4/2010 Kakehata et al. ........... 438/406
2004/0159908 A1 * 8/2004 Fathimulla et al. .......... 257/531

OTHER PUBLICATIONS

Pfeiffer, G., et al., "Wafer Characterization," Silicon Wafer Bonding Technology for VLSI and MEMS applications, EMIS Processing Series 1, IEEE INSPEC, Chapter 5, pp. 83-92.
Tong, Q.-Y., "Principles of Wafer Bonding," Silicon Wafer Bonding Technology for VLSI and MEMS applications, EMIS Processing Series 1, IEEE INSPEC, Chapter 1, pp. 1-20.

* cited by examiner

*Primary Examiner*—Calvin Lee
(74) *Attorney, Agent, or Firm*—Scully, Scott, Murphy & Presser, P.C.; Steven Capella, Esq.

(57) ABSTRACT

A method of forming a semiconductor-on-insulator (SOI) substrate using a thermal annealing process to provide a semiconductor base wafer having a thin high resistivity surface layer that is positioned at the interface with the buried insulating layer is provided. Specifically, the inventive method fabricates an a semiconductor-on-insulator (SOI) substrate having an SOI layer and a semiconductor base wafer that are separated, at least in part, by a buried insulating layer, wherein the semiconductor base wafer includes a high resistivity (HR) surface layer located on a lower resistivity semiconductor portion of the semiconductor base wafer, and the HR surface layer forms an interface with the buried insulating layer.

7 Claims, 3 Drawing Sheets

HIGH RESISTIVITY SOI BASE WAFER USING THERMALLY ANNEALED SUBSTRATE

FIELD OF THE INVENTION

The present invention generally relates to a method of fabricating a semiconductor-on-insulator (SOI) substrate, and more particularly, to a method of forming an SOI substrate including a semiconductor base wafer having a high resistivity (HR) surface layer using a thermal annealing process. The present invention also provides an SOI substrate which includes a semiconductor base wafer that has an HR surface layer.

DESCRIPTION OF THE PRIOR ART

Radio Frequency (RF) applications such as, for example, cell phones, personal digital assistants (PDAs), and other mobile communication devices, which include semiconductor-on-insulator (SOI) substrates require high resistivity (HR) base wafers (greater than 10 Ohm cm). Throughout the present application the term "base wafer" is used to denote the semiconductor layer that is located directly beneath (i.e., abutting) the buried insulating layer; a top semiconductor layer, typically referred to as the device or SOI layer, is located directly above the buried insulating layer. High resistivity SOI base wafers are required in such circumstances to reduce high frequency losses and cross-talk as well as to improve isolation properties. This is discussed in greater detail in U.S. Pat. No. 6,784,494 issued to Mitani and U.S. Patent Application Publication No. 2004/0159908 applied for by Fathimulla et al.

SOI substrates are typically fabricated by one of two methods: Separation by IMplanted OXygen, SIMOX™ or wafer bonding. SIMOX™ is a process in which oxygen ions are implanted into a bulk semiconductor substrate typically using a high dose of oxygen ions ($10^{18}/cm^2$) at energy levels of 200-300 keV. This implant step creates a damaged region within the bulk semiconductor substrate which is healed by thermal annealing (above 1300° C.) to form a Buried OXide (BOX) layer, discussed below. In some cases, nitrogen atoms can be used instead of, or in conjunction with, oxygen atoms. When nitrogen atoms are used, the thermal anneal creates a buried nitride layer in the bulk semiconductor substrate.

Alternatively, a wafer bonding process is employed to fabricate SOI wafers in which two semiconductor wafers, one of which includes a layer of insulating material at the bonding surface, are brought into intimate contact with each other. Room temperature bonding or elevated temperature bonding are used in the wafer bonding process. In some cases, the wafer bonding process may utilize a layer transfer (for example SMARTCUT or Silicon Gensis) process in which hydrogen (or some other species) atoms are implanted in the one of the wafers and after annealing a portion of the wafer including the implanted hydrogen atoms is removed. In an alternative approach, one of the wafers is thinned to a target thickness by mechanical grinding and polishing.

Referring to FIG. 1, a conventional SOI substrate 100 is depicted. As indicated above, the SOI substrate 100 includes a semiconductor base wafer (also referred to as a "handle wafer") 110 and a thin, semiconductor device layer (also referred to an "active semiconductor or SOI layer") 130 that are separated, at least in part, by a buried insulating layer 120. In FIG. 1, the buried insulating layer 120 is illustrated as a continuous layer that is present between the semiconductor base wafer 110 and the SOI layer 130. In some cases (not illustrated), the buried insulating layer is present as a discrete island(s) that is(are) present between the semiconductor base wafer 110 and the SOI layer 130. To obtain the SOI substrate 100 depicted in FIG. 1, a high resistivity (HR) semiconductor base wafer is typically used.

The resulting conventional SOI substrate 100 has an SOI layer 130 that is a device quality layer for coupling circuit structures to the base wafer 100. The buried insulating layer 120 separates the SOI layer 130 from the base wafer 110 both electrically and mechanically permitting improved RF device performance. Moreover, improved RF device performance is provided, such as improved high radio frequency characteristics and low insertion loss due to the base wafer 110 having a constant HR for its full thickness.

The aforementioned conventional SOI substrates have the drawbacks in that high resistivity (HR) semiconductor wafers are relatively expensive. Moreover, there are difficulties in maintaining resistivity stability during the device manufacturing process due to the creation of thermal donors.

In view of the above, there is a need for providing a method of fabricating an SOI substrate in which the above drawbacks have been obviated.

SUMMARY OF THE INVENTION

The present invention provides a method of forming an SOI substrate using a thermal annealing process to provide a semiconductor base wafer having a thin high resistivity surface layer that is positioned at the interface with the buried insulating layer. The present invention also provides an SOI substrate that is produced utilizing the method of the present invention.

In one aspect, the present invention provides a semiconductor-on-insulator (SOI) substrate having an SOI layer and a semiconductor base wafer of a first resistivity that are separated, at least in part, by a buried insulating layer, wherein the semiconductor base wafer includes a surface layer of a second resistivity that is greater than the first resistivity, and said surface layer of said semiconductor base wafer forms an interface with the buried insulating layer.

In the present invention, the SOI layer and the semiconductor base wafer comprise the same or different, preferably the same, semiconductor material. In one embodiment of the present invention, the SOI layer and the semiconductor base wafer are comprised of a semiconductor material such as, for example, Si, SiGe, SiGeC or multilayers thereof. In another embodiment of the present invention, the SOI layer and the semiconductor base wafer are both comprised of silicon.

In some embodiments of the present invention, the SOI layer and the semiconductor base wafer have the same crystal orientation, while in other embodiments, the SOI layer and the semiconductor base wafer have differing crystal orientations. The differing crystal orientations permit for the subsequent formation of a hybrid oriented substrate.

The buried insulating layer of the inventive SOI substrate may comprise an oxide, a nitride, an oxynitride or multilayered combinations thereof. In some embodiments of the present invention, the buried insulating layer is an oxide. The buried insulating layer is continuously present between the SOI layer and the semiconductor base wafer.

Throughout the application, the surface layer having a higher resistivity than the remaining portion of the semiconductor base wafer is referred to as a high resistivity (HR) surface layer. Typically, the HR surface layer has a resistivity of about 50 Ohm cm or greater, with a resistivity from about 200 to about 2000 Ohm cm being even more preferred.

The HR surface layer that is present within the semiconductor base wafer of the inventive SOI substrate has a thickness that may vary depending on the exact conditions that are employed in fabricating the same. Typically, the thickness of the HR surface layer within the semiconductor base wafer of the inventive SOI substrate is from about 200 to about 1500 nm, with a thickness from about 300 to about 1000 nm being even more typical.

In one embodiment, the HR surface layer within the semiconductor base wafer may form a continuous interface with the buried insulating layer. In other embodiments, the HR surface layer within the semiconductor base wafer forms an interface with selected portions of the buried insulating layer.

The SOI layer of the inventive SOI substrate is a thin layer whose thickness is generally within a range from about 50 to about 5000 nm, with a thickness from about 140 to about 1500 nm being more preferred.

In another aspect of the present application, a semiconductor structure including the inventive SOI substrate and at least one semiconductor device such as, for example, a field effect transistor, a bipolar transistor, and/or a capacitor, located upon or within the SOI layer of the SOI substrate is provided.

In addition to the above, the present invention also provides a method of fabricating the inventive SOI substrate. The method of the present invention includes a modified wafer bonding process in which a thermal annealing process is employed to create an HR surface layer within the semiconductor base wafer prior to bonding the semiconductor base wafer with another semiconductor wafer.

In general terms, the method of the present invention comprises:

subjecting a semiconductor base wafer having a first resistivity to a thermal annealing process to create a surface layer of a second resistivity that is greater than the first resistivity within the semiconductor base layer;

providing a second semiconductor wafer for subsequent bonding with said semiconductor base wafer having said surface layer of said second resistivity; and bonding said second semiconductor wafer to said semiconductor base wafer, wherein prior to bonding an insulating layer is formed on at least one of said wafers, and said insulating layer forms an interface with the surface layer of said second resistivity.

The surface layer having the second resistivity, i.e., HR surface layer, has a resistivity of about 50 Ohm cm or greater, with a resistivity from about 200 to about 2000 Ohm cm being even more preferred. For comparison, the remaining portion of the semiconductor base wafer located beneath the HR surface layer has a first resistivity that is from about 1 to about 20 Ohms cm.

The inventive method employs any thermal annealing process that is capable of increasing the resistivity of the surface layer of the semiconductor base wafer. In another embodiment, the thermal annealing process is a hydrogen annealing process.

In one embodiment of the present invention, the hydrogen annealing process is performed in a hydrogen-containing atmosphere in which the hydrogen concentration is from about 5 to about 100%.

In another embodiment of the present invention, the thermal annealing, particularly, the hydrogen thermal anneal, is performed at a temperature greater than about 1000° C. In yet another embodiment, the thermal annealing temperature is from about 1100° to about 1200° C. The duration of the thermal anneal employed in the present invention may vary. Typically, however, the thermal annealing step is performed for a duration that is greater than about 30 minutes. More typically, the duration of the thermal anneal employed in creating the HR surface layer within the semiconductor base wafer is from about 1 hour to about 4 hours.

In some embodiments, the method of the present invention provides an HR surface layer entirely across the full length of the semiconductor base wafer. In other embodiments, the inventive method forms a patterned sacrificial layer of a sufficient thickness on the surface of the semiconductor base wafer prior to subjecting the same to thermal annealing. With this patterned sacrificial layer present on selected portions of the semiconductor base wafer, thermal annealing is performed so as to provide an HR surface layer within selected portions of the semiconductor base wafer which are not protected by the patterned sacrificial layer.

The present invention provides an HR surface layer within the base semiconductor wafer. The presence of the HR surface layer within the semiconductor base wafer reduces the interstitial oxygen concentration and hence suppresses thermal donor formation in the semiconductor base wafer.

DETAILED DESCRIPTION OF THE INVENTION

Figure 1:
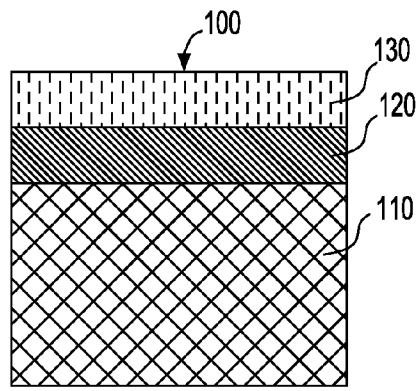
FIG. 1 is a pictorial representation (through a cross sectional view) of a conventional SOI substrate formed by wafer bonding.

The present invention, which provides a method of fabricating an SOI wafer having an HR surface layer within the semiconductor base wafer as well as the SOI wafer that includes the HR surface layer within the semiconductor base layer, will now be described in more detail by referring to the drawings that accompany the present application. In the accompanying drawings, like and corresponding elements are referred to by like reference numerals. It is also noted that the drawings of the present invention representing the structures during the various processing steps of the present invention are provided for illustrative purposes and are thus not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides a method of forming an SOI substrate using a thermal annealing process to provide a semiconductor base wafer having a thin high resistivity surface layer that is positioned at the interface with the buried insulating layer. The present invention also provides an SOI substrate that is produced utilizing the method of the present invention.

Figure 2:
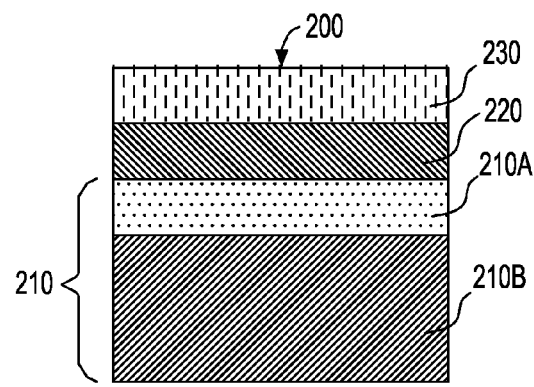
FIG. 2 is a pictorial representation (through a cross sectional view) of an SOI substrate using a hydrogen annealing process to form a semiconductor base wafer having a thin high resistivity surface layer, in accordance with an embodiment of the present invention.

Reference is first made to FIG. 2 which represents an SOI substrate 200 in accordance with an embodiment of the present invention. As shown, the SOI substrate 200 includes an SOI layer 230 and a semiconductor base wafer 210 that are separated, at least in part, by a buried insulating layer 220. The semiconductor base wafer includes a high resistivity (HR) surface layer 210A which forms an interface with the buried insulating layer 220. The HR surface layer 210A is present upon a remaining portion of the initial semiconductor base wafer which has a lower resisitivity than the HR surface layer 210A. In FIG. 2, reference numeral 210B is used to denote the remaining portion of the initial semiconductor base layer 210.

In the present invention, the SOI layer 230 and the semiconductor base wafer 210 comprise the same or different, preferably the same, semiconductor material. The term 'semiconductor material' is used throughout the present invention to denote any material that has semiconductor properties including, for example, Si, SiGe, SiC, SiGeC, Ge alloys, GaAs, InAs, InP and other III/V or II/VI compound semiconductors. In addition to these listed types of semiconducting materials, the present invention also contemplates cases in which at least one of the SOI layer and the semiconductor base wafer is a layered semiconductor such as, for example, Si/SiGe, or Si/SiC.

Preferably, and in one embodiment of the present invention, the SOI layer 230 and the semiconductor base wafer 210 are comprised of a Si-containing semiconductor material such as, for example, Si, SiGe, SiGeC or multilayers thereof. In a highly preferred embodiment of the present invention, the SOI layer 230 and the semiconductor base wafer 210 are both comprised of silicon.

In some embodiments of the present invention the SOI layer and/or the semiconductor base wafer are doped, while in other embodiments the SOI and/or the semiconductor base wafer are undoped. In yet other embodiments, the SOI layer and/or the semiconductor base wafer are unstrained, while in further embodiments the SOI layer and the semiconductor base wafer are strained.

In some embodiments of the present invention, the SOI layer 230 and the semiconductor base wafer 210 have the same crystal orientation, while in other embodiments, the SOI layer 230 and the semiconductor base wafer 210 have differing crystal orientations. The differing crystal orientations permit for the subsequent formation of a hybrid oriented substrate which has at least two surface regions, typically separated by a trench isolation structure, that have the differing crystal orientations. The hybrid oriented substrate can be formed utilizing techniques well known to those skilled in the art.

The buried insulating layer 220 of the inventive SOI substrate 200 may comprise an oxide, a nitride, an oxynitride or multilayered combinations thereof. In some embodiments of the present invention, the buried insulating layer 220 is an oxide, including thermal or non-thermal oxides. The buried insulating layer 220 is continuously present between the SOI layer 230 and the semiconductor base wafer 210 unless processing steps such as trench isolation formation, are employed which intentionally removes portions of the buried insulating layer from the SOI substrate 200.

In the present invention, the high resistivity (HR) surface layer 210A of the semiconductor base wafer 210, which forms an interface with the buried insulating layer 220, has a resistivity that is higher than the remaining portion of the semiconductor base wafer (represented by reference numeral 210B) that is present beneath the HR surface layer 210A. Typically, the HR surface layer 210A has a resistivity of about 50 Ohm cm or greater, with a resistivity from about 200 to about 2000 Ohm cm being even more preferred. The remaining portion 210B of the semiconductor base wafer has a low resistivity (as compared to the HR surface layer) that is typically from about 1 to about 20 Ohms cm.

The HR surface layer 210A that is present within the semiconductor base wafer 210 of the inventive SOI substrate 200 has thickness that may vary depending on the exact conditions that are employed in fabricating the same. Typically, the thickness of the HR surface layer 210A within the semiconductor base wafer 210 of the inventive SOI substrate 200 is from about 200 to about 1500 nm, with a thickness from about 300 to about 1000 nm being even more typical.

In one embodiment, the HR surface layer within the semiconductor base wafer may form a continuous interface with the buried insulating layer. In other embodiments, the HR surface layer within the semiconductor base wafer forms an interface with selected portions of the buried insulating layer.

The buried insulating layer 220 of the inventive SOI substrate 200 has a thickness that is typically from about 50 to about 4000 nm, with a thickness from about 200 to about 2000 nm being even more typical.

The SOI layer 230 of the inventive SOI substrate 200 is a thin layer whose thickness is generally within a range from about 50 to about 5000 nm, with a thickness from about 140 to about 1500 nm being more preferred. The thickness of the SOI layer 230 may be achieved by choosing a semiconductor wafer that has a thickness within the above range, or by utilizing a thinning step during or after bonding which thins the bonded semiconductor wafer into SOI layer 230 having a thickness within the ranges mentioned above.

Figure 3A:
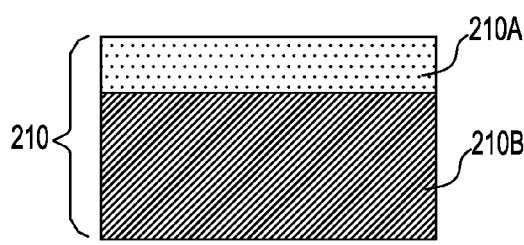
FIGS. 3A-3B are pictorial representations (through cross sectional views) illustrating the basic processing steps that are employed in one embodiment of the present invention in providing the structure shown in FIG. 2.
Figure 3B:
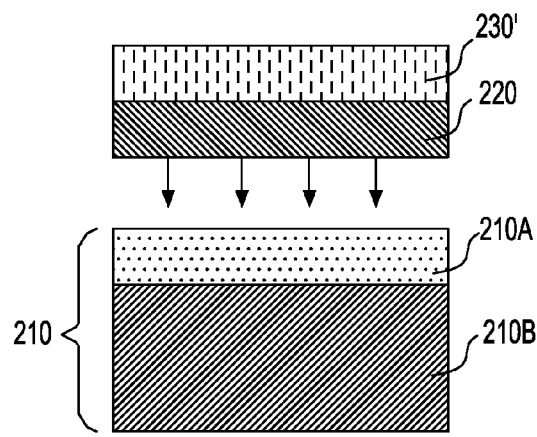

Reference is now made to FIGS. 3A-3B which illustrate basic processing steps that are employed in the present for fabricating the SOI substrate 200 shown in FIG. 2. The method of the present invention, which will now be described in greater detail, includes a modified wafer bonding process in which a thermal annealing process is employed to create the HR surface layer 210A within the semiconductor base wafer 210. The thermal annealing process is employed in the present invention prior to wafer bonding.

As stated above, the method of the present invention includes first subjecting a semiconductor base wafer 210 of low bulk resistivity (i.e., a first resistivity on the order of about 10 to about 1000 Ohm cm) to a thermal annealing process to create a high resistivity (i.e., second resistivity) surface layer 210A within the semiconductor base layer 210. This step of the present invention is illustrated in FIG. 3A; reference numeral 210B denotes the remaining portion of the semiconductor base wafer 210. As stated above, the remaining lower portion 210B of the semiconductor base wafer has a lower resistivity in comparison to the HR surface layer 210A.

The inventive method employs any thermal annealing process that is capable of increasing the resistivity of the surface layer of a low bulk resistivity semiconductor base wafer 210 to a resistivity value on the order of about 50 ohms cm or greater.

In one highly preferred embodiment of the present invention, the thermal annealing process is a hydrogen annealing process. In one embodiment of the present invention, the hydrogen annealing process is performed in a hydrogen-containing atmosphere in which the hydrogen concentration is from about 5 to about 100%. By "hydrogen-containing atmosphere" it is meant an ambient that includes hydrogen atoms. Examples of hydrogen-containing atmospheres that can be employed in the present invention include, $H_2$. In some embodiments, the hydrogen-containing atmosphere is a mixture including an inert gas such as, for example, He, Ar, $N_2$ or mixtures thereof.

In another embodiment of the present invention, the thermal annealing, particularly, the hydrogen thermal anneal, is performed at a temperature greater than about 1000° C. In yet another embodiment, the thermal annealing temperature is from about 1100° to about 1200° C. The duration of the thermal anneal employed in the present invention may vary. Typically, however, the thermal annealing step is performed for a duration that is greater than about 30 minutes. More typically, the duration of the thermal anneal employed in creating the HR surface layer within the semiconductor base wafer is from about 1 hour to about 4 hours.

The semiconductor base wafer 210 shown in FIG. 3A will be subsequently bonded to a second semiconductor wafer (which subsequently forms the SOI layer 230). Since the second semiconductor wafer is used in forming the SOI layer 230 of the inventive SOI substrate 200, it is referred to herein as the SOI layer-containing wafer. Prior to wafer bonding, an insulating layer (which forms the buried insulating layer 220 of the inventive SOI substrate 200) is formed on at least one of the wafer surfaces that will be bonded together. The insulating layer 220' is shown in FIG. 2B as being present on the surface of the SOI layer-containing wafer 230'. In another embodiment, the insulating layer is formed on the HR surface layer of the base semiconductor wafer. In another embodiment, an insulating layer is present on the HR surface layer as well as the SOI layer-containing wafer.

Notwithstanding which of these embodiments is employed in the present invention, the insulating layer may be formed by a deposition process including, for example, chemical vapor deposition (CVD), plasma enhanced chemical vapor deposition (PECVD), atomic layer deposition (ALD), chemical solution deposition, and evaporation. Alternatively, the insulating layer may be formed by a thermal process including for example, oxidation and/or nitridation.

Semiconductor-to-semiconductor wafer bonding is achieved in the present invention, as shown, for example, in FIG. 3B by first bringing the two wafers (semiconductor base wafer 210' and SOI layer-containing wafer 230') into intimate contact with each other; optionally applying an external force to the contacted wafers; and then optionally annealing the two contacted wafers under conditions that are capable of increasing the bonding energy between the two wafers. The arrows present in FIG. 3B denote the direction of bringing the two wafers into intimate contact with one another.

The annealing step may be performed in the presence or absence of an external force. Bonding is achieved typically during the initial contact step at nominal room temperature. By nominal room temperature, it is meant a temperature from about 15° to about 40° C., with a temperature of about 25° C. being more preferred.

Although nominal room temperature bonding is typically used in the present invention, higher bonding temperatures as known in the art can also be employed herein without impacting the beneficial effects of the present invention.

After bonding, the wafers are typically annealed to enhance the bonding strength and improve the interface property. The annealing temperature is typically carried out at a temperature from about 900° to about 1300° C., with annealing temperature from about 1000° to about 1150° C. being more typical. Annealing is performed within the aforementioned temperature ranges for various time periods that may range from about 1 hour to about 24 hours. The annealing ambient can be $O_2$, $N_2$, Ar, or a low vacuum, with or without external adhesive forces. Mixtures of the aforementioned annealing ambients, with or without an inert gas, are also contemplated herein.

Although high-temperature annealing (as described above) is often used, it is also possible to use a low temperature anneal (less than 900° C.) which can also achieve good mechanical and electrical properties.

It should be noted that the annealing step that follows the direct semiconductor-to-semiconductor bonding step can be performed at a single temperature using a specific ramp-up rate, or it can be performed using various temperatures in which various ramp-up rates and soak cycles are employed.

To obtain a certain predetermined thickness of the SOI-containing wafer 230', various layer transfer techniques can be used in the present invention. One direct and simple approach that can be used in the present invention is to use wafer grinding, polishing or an etch back process.

Another layer transfer technique, applicable to embodiments where one of the wafers includes an ion implant region. In this case, the ion implant region forms a high stress/blistered region which causes the implanted crystal to cleave along the plane defined by the ion implantation, leaving a bonded wafer such as is shown, for example, in FIG. 2. The implant region is typically comprised of hydrogen ions that are implanted into the surface of one of the wafers utilizing ion implantation conditions that are well known to those skilled in the art. After bonding, a heating step is typically performed in an inert ambient at a temperature from about 100° to about 400° C. for a time period from about 2 to about 30 hours to increase the bonding energy. More preferably, the heating is performed at a temperature from about 200° to about 300° C. for a time period from about 2 to about 20 hours. The term "inert ambient" is used in the present invention to denote an atmosphere in which an inert gas, such as He, Ar, $N_2$, Xe, Kr or a mixture thereof, is employed. A preferred ambient used during the bonding process is $N_2$. The layer splitting at the implant region 22 will take place during a 350°-500° C. annealing afterwards. Other temperatures are also contemplated in the present application. In some embodiments, mechanical cleaning can be employed at nominal room temperature.

Figure 4A:
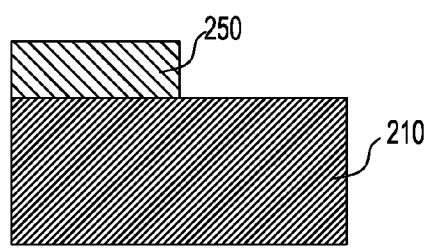
FIGS. 4A-4B are pictorial representations (through cross sectional views) depicting alternative processing steps that can be used in the present invention.
Figure 4B:
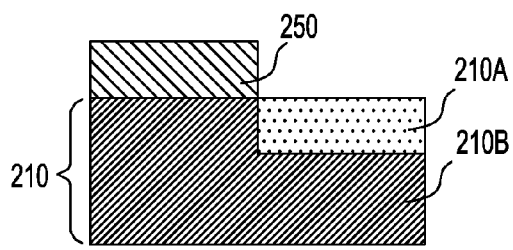

In other embodiment of the present invention, the inventive method forms a patterned sacrificial layer 250 of a sufficient thickness of the surface of the semiconductor base wafer 210 prior to subjecting the same to thermal annealing. This embodiment is shown in FIG. 4A. The patterned sacrificial layer 250 may comprise an exposed and developed photoresist, a hard mask (such as an oxide and/or nitride) or any combination thereof. The sacrificial layer is formed utilizing a conventional deposition or thermal growing process. Patterning is achieved by lithography and optionally etching. With this patterned sacrificial layer 250 present selected portions of the semiconductor base wafer 210 are thermally annealed as described above providing an HR surface layer 210A within selected portions of the semiconductor base wafer 210 as is shown in FIG. 4B.

The patterned sacrificial layer 250 is removed after thermal annealing and prior to bonding utilizing a conventional removal process such as, for example, ashing (when a photoresist material is employed), etching, chemical mechanical polishing or grinding.

The present invention provides an HR surface layer within the base semiconductor wafer. The presence of the HR surface layer within the semiconductor base wafer reduces the interstitial oxygen concentration and hence suppresses thermal donor formation in the semiconductor base wafer; thermal donors modify the material's resistivity and can lower the resistivity of the base wafer during the device process.

Figure 5:
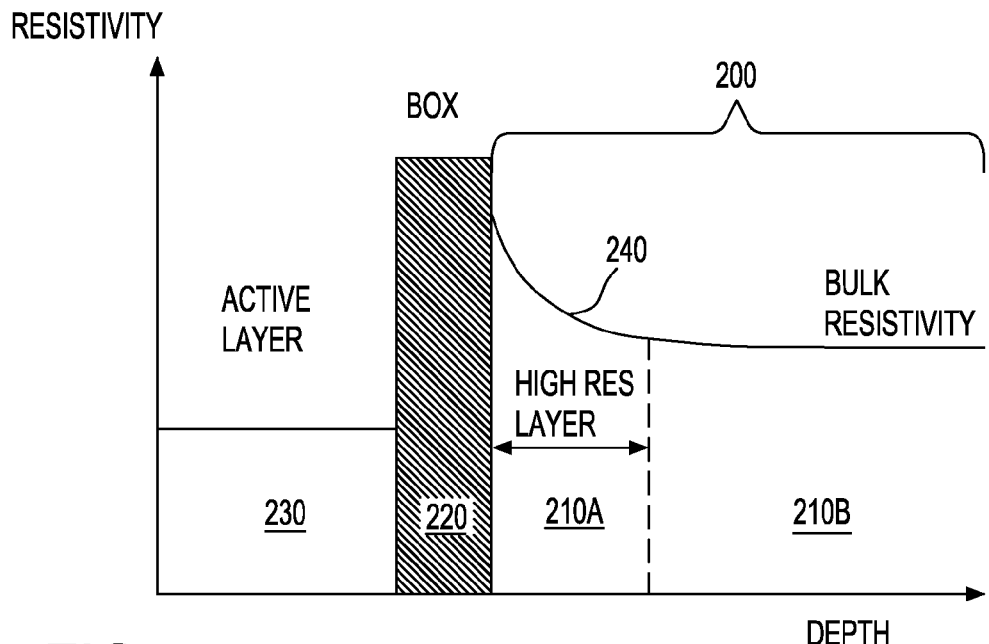
FIG. 5 is a graphical representation of the resistivity profile vs. depth of an SOI substrate in accordance with an embodiment of the present invention.

FIG. 5 is a graphical representation of the resistivity profile of an SOI substrate 200 from finish to device line in accordance with an embodiment of the present invention. As shown in FIG. 5, the SOI (or active) layer 230 has the lowest resistivity level while the buried insulating layer, particularly a buried oxide or BOX layer, 220 has the highest resistivity level. The semiconductor base wafer 210 has a high resistivity surface layer 210A atop a lower bulk resistivity portion 210B. In accordance with the present invention, the high resistivity property of the semiconductor base wafer is limited to a thin layer in the semiconductor base wafer 210 located immediately beneath the BOX layer 220 and tapering off as shown by the downward curve 240 to the lower bulk resistivity portion 210B.

Figure 6:
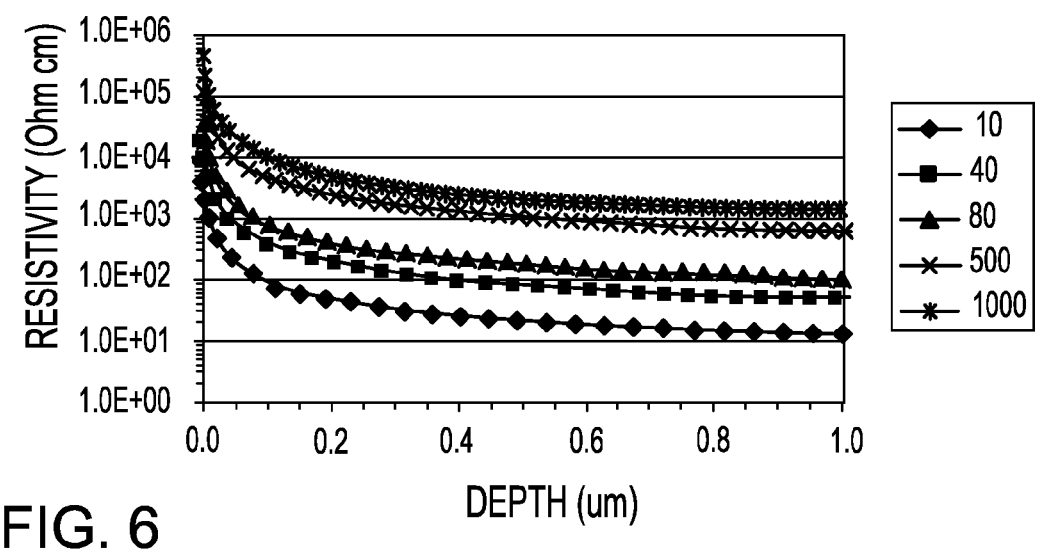
FIG. 6 is a graphical representation of the resistivity (ohm cm) vs. depth ($\mu$m) of SOI substrates at different initial resistivity levels in accordance with an embodiment of the present invention.

FIG. 6 is a graphical representation of the resistivity profile of an SOI wafer 200, which more clearly illustrates the thin high resistivity layer 210A of FIG. 5. Specifically, FIG. 6 illustrates the resistivity profile as a function of distance from the surface of a base wafer 210 for different resistivity values (10, 40, 80, 500 and 1,000 Ohm cm) as measured prior to the high temperature annealing treatment (1 hour at 1200° C. in a hydrogen atmosphere).

In the conventional wafer bonding technique, as discussed above, two wafers are bonded together and then subjected to thermal annealing. During the thermal annealing of the joined wafers, so-called 'thermal donors' are generated which modify the resistivity profile of the base semiconductor wafer. These post-processing thermally generated donors reduce the resistivity at both the buried insulating layer/base wafer interface and the back of the wafer. Thermal donors are microscopic structures that appear in oxygen-rich silicon when annealed in the temperature range 300°-550° C.

Figure 7:
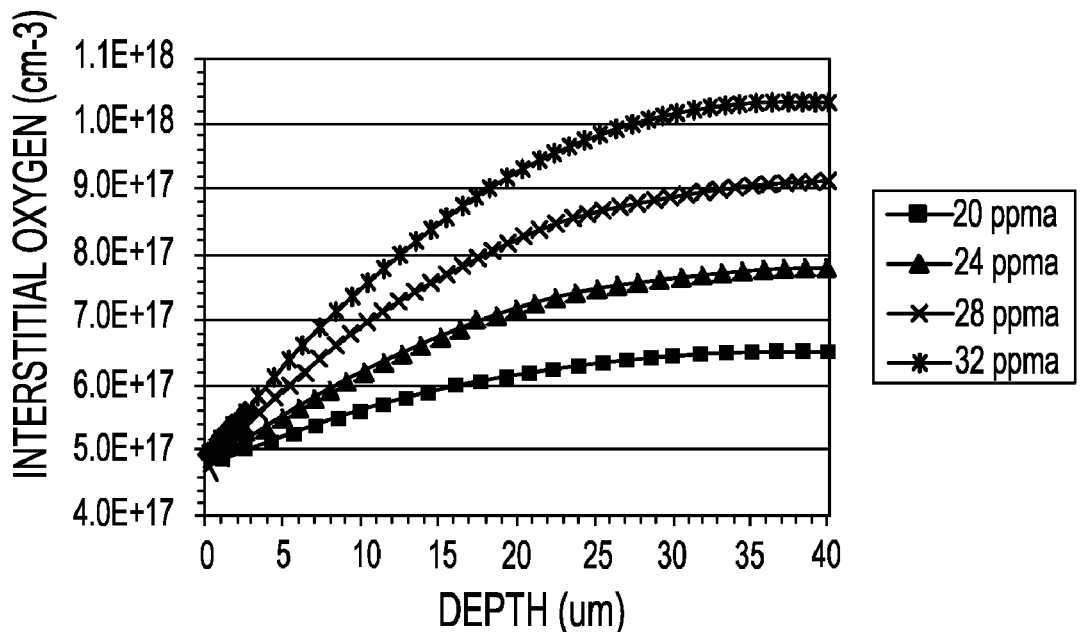
FIG. 7 is a graphical representation of the interstitial oxygen concentration ($cm^{-3}$) vs. depth ($\mu$m) of SOI wafers at different oxygen concentration levels in accordance with an embodiment of the present invention.

The presence of the HR surface layer within the semiconductor base layer suppresses the later formation of thermal donors. In particular, the oxygen content of the SOI substrate is reduced by outdiffusion of oxygen in the surface layers of the SOI substrate (i.e., BOX layer/base wafer interface and the back of the wafer). As can be seen in FIG. 7, interstitial oxygen values are significantly reduced at depths of 0-5 microns by a hydrogen annealing process of one embodiment of the present invention. Specifically, FIG. 7 shows the interstitial oxygen concentration as a function of depth from the surface of the base wafer 210 for different initial oxygen concentrations (20, 24, 28, 32 ppma, [parts per million (atomic), per ASTM standard F121]) after the thermal annealing treatment (1 hour at 1200° C. in a hydrogen atmosphere).

One skilled in the art would know that various concentration profiles could be employed in combination with controlling the post-processing thermal annealing process to obtain varying resistivity profiles of the semiconductor base wafer including the HR surface layer. In other words, different RF applications might require base wafers having larger or smaller HR surface layer and by modifying the concentration profiles by controlling the hydrogen annealing process one skilled in the art could use the present invention to produce a base wafer of an SOI substrate having a desired or tailored HR surface layer.

Figure 8:
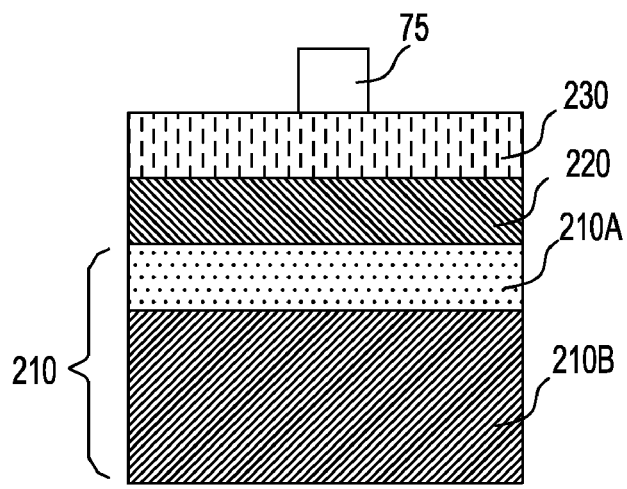
FIG. 8 is a pictorial representation of the SOI substrate of FIG. 2 with one semiconductor device located on the surface of the SOI layer.

In another aspect of the present application, and as shown in FIG. 8, a semiconductor structure 50 including the inventive SOI substrate 200 and at least one semiconductor device 75 is provided. The at least one semiconductor device 75 includes any semiconductor device such as, for example, a field effect transistor, a bipolar transistor, and/or a capacitor, located upon or within the SOI layer of the inventive substrate. The exact components of the at least one semiconductor device and the method of fabricating the same are well known to those skilled in the art and are not provided herein so as not to obscure the concept of the present invention.

While there has been shown and described what is considered to be preferred embodiments of the invention, it will, of course, be understood that various modifications and changes in form or detail could readily be made without departing from the spirit of the invention. It is therefore intended that the scope of the invention not be limited to the exact forms described and illustrated, but should be construed to cover all modifications that may fall within the scope of the appended claims.

What is claimed is:

1. A method of fabricating a semiconductor-on-insulator (SOI) substrate comprising:
   subjecting a semiconductor base wafer having a first resistivity to a thermal annealing process to create a surface layer of a second resistivity that is greater than the first resistivity within the semiconductor base layer;
   providing a second semiconductor wafer for subsequent bonding with said semiconductor base wafer having said surface layer of said second resistivity; and
   bonding said second semicoductor wafer to said semiconductor base wafer, wherein prior to bonding an insulating layer is formed on at least one of said wafers, and said insulating layer forms an interface with the surface layer of said second resistivity forming a patterned sacrificial layer on said semiconductor base layer prior to said thermal annealing process, said patterned sacrificial layer having a sufficient thickness to prevent formation of said surface layer of second resistivity within remaining portions of said semiconductor base wafer that lay beneath said patterned sacrificial layer.

2. The method of claim 1 wherein said thermal annealing process is a hydrogen annealing process.

3. The method of claim 2 wherein said hydrogen annealing process is performed in a hydrogen-containing atmosphere in which the hydrogen concentration is from about 5 to about 100%.

4. The method of claim 1 wherein said thermal annealing is performed at a temperature greater than about 1000° C.

5. The method of claim 4 wherein said temperature is from about 1100° to about 1200° C.

6. The method of claim 1 wherein said bonding comprising bringing the semiconductor base wafer and second semiconductor wafer into intimate contact with each other; optionally applying an external force to the contacted wafers; and then optionally annealing the two contacted wafers under conditions that are capable of increasing the bonding energy between the two wafers.

7. The method of claim 1 wherein said forming said insulating layer comprises a deposition process or a thermal growth process.

* * * * *